United States Patent [19]
Delage et al.

[11] Patent Number: 5,135,887
[45] Date of Patent: Aug. 4, 1992

[54] BORON SOURCE FOR SILICON MOLECULAR BEAM EPITAXY

[75] Inventors: Sylvain L. Delage, Paris, France; Bruce A. Ek, Pelham Manor; Subramanian S. Iyer, Yorktown Heights, both of N.Y.

[73] Assignee: International Business Machines Corporation, Armonk, N.Y.

[21] Appl. No.: 712,859

[22] Filed: Jun. 10, 1991

Related U.S. Application Data

[62] Division of Ser. No. 419,188, Oct. 10, 1989, abandoned.

[51] Int. Cl.$^5$ .................. H01L 21/203; C22C 29/00; C22C 28/00
[52] U.S. Cl. ..................... 437/106; 437/165; 437/936; 156/DIG. 83; 156/DIG. 103; 156/DIG. 86; 156/DIG. 102; 427/42
[58] Field of Search .............. 437/165, 81, 95, 105, 437/106, 146, 168, 169, 936, 949, 951, 971, 159, 107; 148/DIG. 17, 41, 46, 48, 127, 169; 118/726, 727; 156/610-614, DIG. 83, DIG. 103; 427/248.1, 255.1, 255.2; 423/289; 420/578, 556

[56] References Cited

U.S. PATENT DOCUMENTS 3,765,940 10/1973 Hentzschel .
4,385,946 5/1983 Finegan et al. .
4,392,453 7/1983 Luscher .
4,775,425 10/1988 Guha et al. ............... 420/556

FOREIGN PATENT DOCUMENTS 451778 11/1974 U.S.S.R. ................... 420/578

OTHER PUBLICATIONS

Ota, "Silicon Molecular Beam Epitaxy", Twin Solid Films, 106 (1983), pp. 3, 25.

Primary Examiner—Olik Chaudhuri
Assistant Examiner—Andrew Griffis
Attorney, Agent, or Firm—John J. Goodwin

[57] ABSTRACT

A simple effective and fairly stable boron source that is easy to prepare and simple to operate under UHV processing conditions is disclosed. The method for fabricating this boron source includes the in situ alloying of boron into a high melting point elemental semiconductor material, preferably silicon, in the hearth of an electron beam evaporator. A supersaturated solution of boron in silicon is created by melting the silicon and dissolving the boron into it and quenching the solution. The boron needs to be of high purity and may be in the form of crystalline granules for this to take place under controlled conditions and moderate power levels. When silicon is evaporated from this resultant silicon-boron alloy source, the silicon evaporates uncontaminated from a molten pool of the alloy in the center of the hearth. A segregation of boron into the liquid phase occurs and a segregation takes place from this molten phase into the vapor phase that is being evaporated from the pool. The boron incorporates without complex kinetics into the growing layers such as Si, Ge, Si-Ge alloys and metals as a dopant.

3 Claims, 1 Drawing Sheet

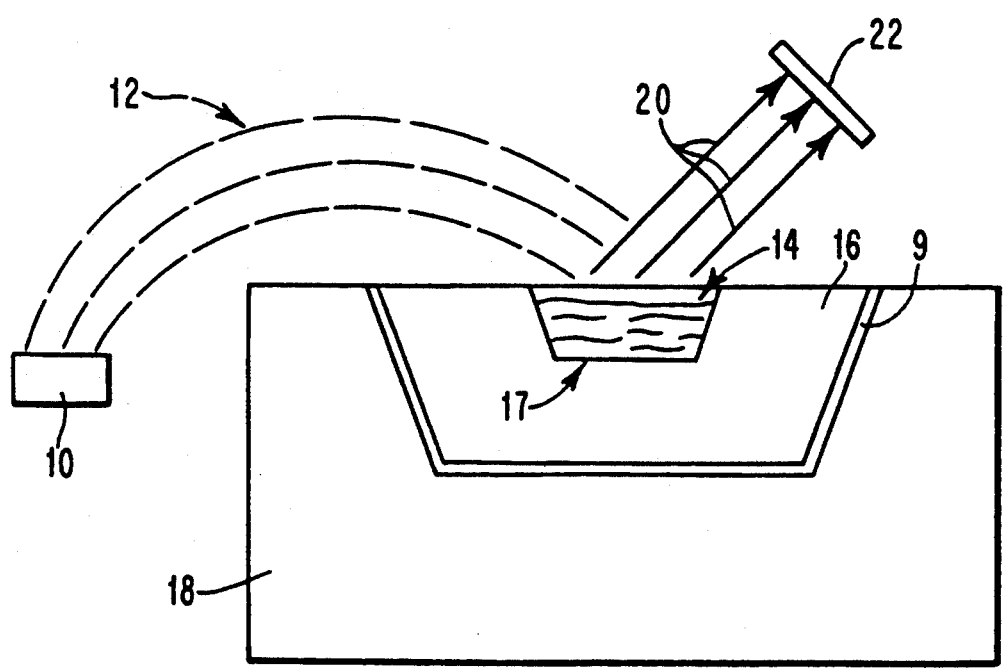

BORON SOURCE FOR SILICON MOLECULAR BEAM EPITAXY

This application is divisional of Ser. No. 07/419,188, filed Oct. 10, 1989, now abandoned.

BACKGROUND OF THE INVENTION

1. Field of the Invention

The present invention relates generally to a doping process for silicon films using Molecular Beam Epitaxy (MBE) and, more specifically, to a novel boron doping source for silicon MBE.

2. Description of the Prior Art

SILICON MOLECULAR BEAM EPITAXY (N ON N+) WITH WIDE RANGE DOPING CONTROL. Ota, Yusuke, *J. Electrochen. Soc.* 1977, 124 (11), 1795-802. Si single-crystal films were prepared by the molecular beam epitaxy technique in a ultrahigh vacuum. Sb-doped epitaxial films were grown on Czochralski grown n+ ($p \leq 0.003$ Ω-cm) (111) or (100) substrates from 600° to 1050°. The doping of the films was controlled from high $10^{13}$ to high $10^{17}/cm^3$. The p-type epitaxial film on n+ substrate were also gown from a B-doped source. Transmission electron microscopy and preferential dislocation etching revealed that the epitaxial films are high quality single crystals with low dislocation. The electrical properties on the epitaxial films are bulklike. The p+−n−n+ diodes were fabricated on these films and they showed low reverse leakage current and sharp breakdown. These diodes operate excellently at mm wave frequencies.

ENHANCED STICKING COEFFICIENTS AND IMPROVED PROFILE CONTROL USING BORON AND ANTIMONY AS COEVAPORATED DOPANTS IN SILICON-MBE. A. A. Kubiak et al. *J. Vac. Sci. Technol.*, B 1985, 3(2), 592-5. Inefficient doping and poor profile control are generally associated with the use of coevaporated dopants in Si MBE. However, two new techniques were developed, one applicable to p-type and the other n-type doping, which alleviate these problems. Coevaporated B (p-type) has a simple incorporation mechanism by which good doping and profile control can be achieved using the conventional MBE technique of changing the source cell temperature. For n-type doping, a method of enhancing the low incorporation efficiency of Sb was found (potential enhanced doping) which is also ideally suited to profile control. Enhancements by a factor of up to 1000 times were achieved. Material with bulklike mobilities was obtained over the range of $1 \times 10^{15}$ to $8 \times 10^{19}$ cm$^{-3}$ for p-type and up to $3 \times 10^{19}$ cm$^{-3}$ for n-type doping. Extremely sharp doping transitions down to <100 Å/decade were obtained.

Other background references includes the following.

U.S. Pat. No. 4,317,680 issued Mar. 2, 1982 to Chu et al entitled DIFFUSION SOURCE AND METHOD OF PREPARING, is directed to a diffusion source for establishing a p-type conductivity region in a semiconductor device and to a method for preparing such diffusion source. The diffusion source consists of pure silicon powder diffused with a p-type impurity.

U.S. Pat. No. 3,558,376 issued Jan. 26, 1971 to Schmidt et al entitled METHOD FOR CONTROLLED DOPING BY GAS OF FOREIGN SUBSTANCE INTO SEMICONDUCTOR MATERIALS, describes a controlled process for introducing foreign substances, e.g., dopants and recombination centers, into a molten semiconductor body by directing foreign substance in gaseous form in the immediate vicinity of the melt.

U.S. Pat. No. 3,949,119 issued Apr. 6, 1976 to Shewchen et al entitled METHOD OF GAS DOPING OF VACUUM EVAPORATED EPITAXIAL SILICON FILMS, describes a technique for the controlled incorporation of doping impurities into homoepitaxial silicon films by gas bombardment with arsine and diborane.

U.S. Pat. No. 4,447,276, issued May 8, 1984 to Davies et al entitled MOLECULAR BEAM EPITAXY ELECTROLYTIC DOPANT SOURCE, discloses a method of growing crystalline semiconductors such as GaAs. The method involves epitaxial deposition from the vapor phase and provides dopant material such as sulphur in the form of a molecular beam. The molecular beam is developed by effusion from a knudsen cell. The difficulties previously encountered using sulphur as such a cell are counteracted by use of an electrochemical cell as the sulphur source. The technique allow complicated doping profiles to be produced.

SUMMARY OF THE INVENTION

One of the advantages of the silicon MBE process lies in its ability to obtain both n-type and p-type doped films with almost atomic level concentration abruptness. The doping capability is, however, comprised by the limited choice of dopants available for use in silicon related MBE. The most popular dopant for p-type films is boron, however, it may not be used as an elemental doping source because it requires temperature of over 3000° C. to effuse and this is incompatible with Ultra High Vacuum (UHV) practice because of the inability to keep other impurity levels low. Boron may be evaporated directly by electron beam evaporation, but the control at fluxes that would be required for doping silicon would be impossible. Other p-type dopants, such as Ga and In, are both too deep in the band gap of silicon and also have rather low solubilities in silicon. Ion beam doping could possible be used but is quite complex. The use of compound boron sources such as $B_2O_3$ result in excessive oxide contamination of films at normally used MBE growth temperatures.

Thus, there is a need for a simple boron source for doping silicon or related metals and alloys.

An object of the present invention is to provide a method for making a silicon-boron alloy source for doping semiconductors including the steps of mixing silicon and boron in a hearth and melting the silicon and boron in the hearth.

Still another object of the present invention is to provide a method for making a silicon-boron alloy by the melting of silicon and boron by an electron beam.

A further object of the present invention is to provide a silicon-boron alloy which is used to dope semiconductors such as silicon or related metals and alloys.

BRIEF DESCRIPTION OF THE DRAWING

The novel features and elements characteristic of the invention are set forth in the appended claims. The invention itself, however, will be best understood by reference to the detailed description which follows in conjunction with the accompanying drawings, wherein:

The FIGURE is a schematic diagram that shows an embodiment of the present invention.

DETAILED DESCRIPTION OF THE INVENTION

A simple effective and fairly stable boron source that is easy to prepare and simple to operate under UHV processing conditions is disclosed. The method for fabricating this boron source includes the in situ alloying of boron into a high melting point elemental semiconductor material, preferably silicon, in the hearth of an electron beam evaporator. A supersaturated solution of boron in silicon is created by melting the silicon and dissolving the boron into it and quenching the solution. The boron needs to be of high quality and may be in the form of crystalline granules for this to take place under controlled conditions and moderate power levels. When silicon is evaporated from this resultant silicon-boron alloy source, the silicon evaporates uncontaminated from a molten pool of the alloy in the center of the hearth. A segregation of boron into the liquid phase occurs and a segregation takes place from this molten phase into the vapor phase that is being evaporated from the pool. The boron incorporates without complex kinetics into the growing layers such as Si, Ge, Si-Ge alloys and metals as a dopant. Furthermore, extremely high boron concentrations greater than 1E20 are easily obtained and such unique concentration levels have been demonstrated with no other contamination such as oxygen, nitrogen, tantalum being present in the doped layer.

The method of this invention can also be used to provide an alloy of boron and germanium as the high melting point elemental semiconductor material instead of silicon. Furthermore, the doping level that is obtained from the boron-silicon source of this invention is not dependent on the substrate temperature.

The method of the present invention uses the well-known technique of molecular beam epitaxial (MBE) growth to form a boron doped silicon film from a novel boron source. In MBE, a beam of molecules of the material to be deposited is emitted on to a substrate from an effusion source. The effusion source is disposed in a hearth located within a closed chamber containing an orifice and means are provided for heating the hearth during evacuation to ultrahigh vacuums. The chamber houses the source whose vapor is required to effuse through the orifice to be deposited onto a target.

The molecular beam epitaxy process is commonly used to incorporate dopants into semiconductor target material, the dopants also being provided as a molecular beam.

The present invention provides a method of growing solid material from the vapor phase by epitaxial deposition on a target substrate using a molecular beam formed from controlled evaporation of the source material.

Referring to the drawing, the FIGURE shows means for first forming an alloy of the novel source material, such as boron and silicon and also means for evaporating the source material and doping a substrate therewith using a molecular beam epitaxial process. In the FIGURE, an electron emitter 10 emits and sends out an electron beam 12 of high energy electrons directed onto and bombarded boron which may be high purity crystalline boron granules. The electron beam 12 is also directed onto silicon to form a boron-silicon melt 14, contained in the hearth of an electron beam evaporator 18, having a cavity 16, to hold the melt 14.

The silicon-boron alloy formed as described is used as the effusion source in an MBE process to dope a semiconductor target. Using conventional MBE process structures and techniques, the silicon-boron melt 14 is directed as a molecular beam 20 of boron and silicon particles onto target 22.

The percentage of boron in the boron-silicon melt is not critical. There is wide latitude in the doping deposition of target 22 by selecting the boron concentration and the evaporation rate as desired.

The process described in this invention is carried out in an ultra high vacuum environment so that there is little or no contamination.

The target 22 is normally fixed in one position but it could also be placed on a rotating type of a mechanism (not shown) to provide a more uniform doping.

In the FIGURE, the electron beam source 10 is shown disposed laterally relative to evaporator 18 such that the electron beam 12 is directed by electron beam device such as lenses and focussing elements. One skilled in the art will appreciate that other configurations are possible, for example, electron source 10 may be disposed above the hearth 16 and the target 22 may be disposed parallel to the top of the hearth 16.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Having thus described our invention, what we claim as new, and desire to secure by Letters Patent is:

1. A method of doping a substrate composed of germanium comprising the steps of:
    (a) the step of making an alloy of boron and a high melting point elemental semiconductor material for doping semiconductors by mixing boron and said elemental semiconductor material in a hearth and melting and quenching said elemental semiconductor material and boron in said hearth;
    (b) the step of directing a beam of electrons onto said alloy thereby vaporizing said alloy to form a molecular beam, and
    (c) the step of directing said molecular beam of vaporized boron and elemental semiconductor material onto the surface of said substrate to dope said germanium substrate with said boron.

2. The method of claim 1 wherein said substrate is composed of silicon-germanium alloy.

3. The method of claim 2 wherein said elemental semiconductor material is germanium.

* * * * *